US012563828B2

(12) United States Patent
     Lin et al.

(10) Patent No.: US 12,563,828 B2
(45) Date of Patent:       Feb. 24, 2026

(54) FIN HEIGHT AND STI DEPTH FOR PERFORMANCE IMPROVEMENT IN SEMICONDUCTOR DEVICES HAVING HIGH-MOBILITY P-CHANNEL TRANSISTORS

(71) Applicant: Taiwan Semiconductor Manufacturing Co., Ltd., Hsinchu (TW)

(72) Inventors: Kun-Yu Lin, Hsinchu (TW); En-Ping Lin, Hsinchu (TW); Yu-Ling Ko, Hsinchu (TW); Chih-Teng Liao, Hsinchu City (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 393 days.

(21) Appl. No.: 17/818,571

(22) Filed: Aug. 9, 2022

(65) Prior Publication Data

US 2022/0384273 A1     Dec. 1, 2022

Related U.S. Application Data

(62) Division of application No. 17/158,522, filed on Jan. 26, 2021, now Pat. No. 12,356,710.

(Continued)

(51) Int. Cl.
     *H10D 84/85*      (2025.01)
     *H01L 21/02*      (2006.01)
     (Continued)

(52) U.S. Cl.
     CPC ..... *H10D 84/853* (2025.01); *H01L 21/02293* (2013.01); *H01L 21/0245* (2013.01);
     (Continued)

(58) Field of Classification Search
     CPC ........... H01L 27/0924; H01L 21/02293; H01L 21/0245; H01L 21/02532; H01L 21/3065;
     (Continued)

(56)                References Cited

U.S. PATENT DOCUMENTS 6,228,731 B1 *   5/2001  Liaw ................. H01L 21/76831
                                                257/E21.507
8,476,137 B1     7/2013  LiCausi et al.
                 (Continued)

FOREIGN PATENT DOCUMENTS

CN         101261991 A    9/2008
CN         104347425 A    2/2015
                 (Continued)

OTHER PUBLICATIONS ip.com search (Year: 2025).*

*Primary Examiner* — Zandra V Smith
*Assistant Examiner* — Andre C Stevenson
(74) *Attorney, Agent, or Firm* — HAYNES AND BOONE, LLP

(57)                ABSTRACT

A method includes providing a substrate having a first semiconductor material; creating a mask that covers an nFET region of the substrate; etching a pFET region of the substrate to form a trench; epitaxially growing a second semiconductor material in the trench, wherein the second semiconductor material is different from the first semiconductor material; and patterning the nFET region and the pFET region to produce a first fin in the nFET region and a second fin in the pFET region, wherein the first fin includes the first semiconductor material and the second fin includes a top portion over a bottom portion, wherein the top portion includes the second semiconductor material, and the bottom portion includes the first semiconductor material.

9 Claims, 12 Drawing Sheets

Related U.S. Application Data

(60) Provisional application No. 63/072,521, filed on Aug. 31, 2020, provisional application No. 63/065,189, filed on Aug. 13, 2020.

(51) Int. Cl.

| | |
|---|---|
| *H01L 21/3065* | (2006.01) |
| *H01L 21/308* | (2006.01) |
| *H10D 30/01* | (2025.01) |
| *H10D 30/62* | (2025.01) |
| *H10D 84/01* | (2025.01) |
| *H10D 84/03* | (2025.01) |

(52) U.S. Cl.

CPC .... *H01L 21/02532* (2013.01); *H01L 21/3065* (2013.01); *H01L 21/308* (2013.01); *H10D 30/0245* (2025.01); *H10D 30/6211* (2025.01); *H10D 84/0158* (2025.01); *H10D 84/0167* (2025.01); *H10D 84/0188* (2025.01); *H10D 84/0193* (2025.01); *H10D 84/038* (2025.01)

(58) Field of Classification Search

CPC ........... H01L 21/308; H01L 21/823431; H01L 21/823807; H01L 21/823821; H01L 21/823878; H01L 29/66818; H01L 29/7851

See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 10,535,654 | B2 | 1/2020 | Tsai et al. |
| 2008/0142478 | A1* | 6/2008 | Miller .................... G03F 7/425 216/49 |
| 2008/0230852 | A1 | 9/2008 | Yu et al. |
| 2008/0265338 | A1 | 10/2008 | Yu et al. |
| 2015/0028454 | A1 | 1/2015 | Cheng et al. |
| 2015/0035023 | A1 | 2/2015 | Kim et al. |
| 2016/0336428 | A1 | 11/2016 | Cheng et al. |
| 2016/0379982 | A1 | 12/2016 | You et al. |
| 2017/0047331 | A1 | 2/2017 | Chen et al. |
| 2018/0240714 | A1* | 8/2018 | Bi .................. H01L 21/823807 |
| 2018/0247938 | A1 | 8/2018 | Cheng et al. |
| 2019/0096997 | A1 | 3/2019 | More et al. |
| 2019/0097056 | A1 | 3/2019 | Kuo et al. |
| 2019/0157159 | A1 | 5/2019 | Wen et al. |
| 2019/0287967 | A1 | 9/2019 | Liaw |
| 2020/0052114 | A1* | 2/2020 | Cheng ................. H01L 29/6653 |

FOREIGN PATENT DOCUMENTS

| | | | |
|---|---|---|---|
| CN | 109585291 | A | 4/2019 |
| CN | 109585560 | A | 4/2019 |
| KR | 20160074122 | A | 6/2016 |
| KR | 20180060952 | A | 6/2018 |
| KR | 20180137861 | A | 12/2018 |
| KR | 20190138012 | A | 12/2019 |
| TW | 201351486 | A | 12/2013 |
| TW | 201543678 | A | 11/2015 |
| TW | 201628087 | A | 8/2016 |
| TW | 201709526 | A | 3/2017 |

* cited by examiner

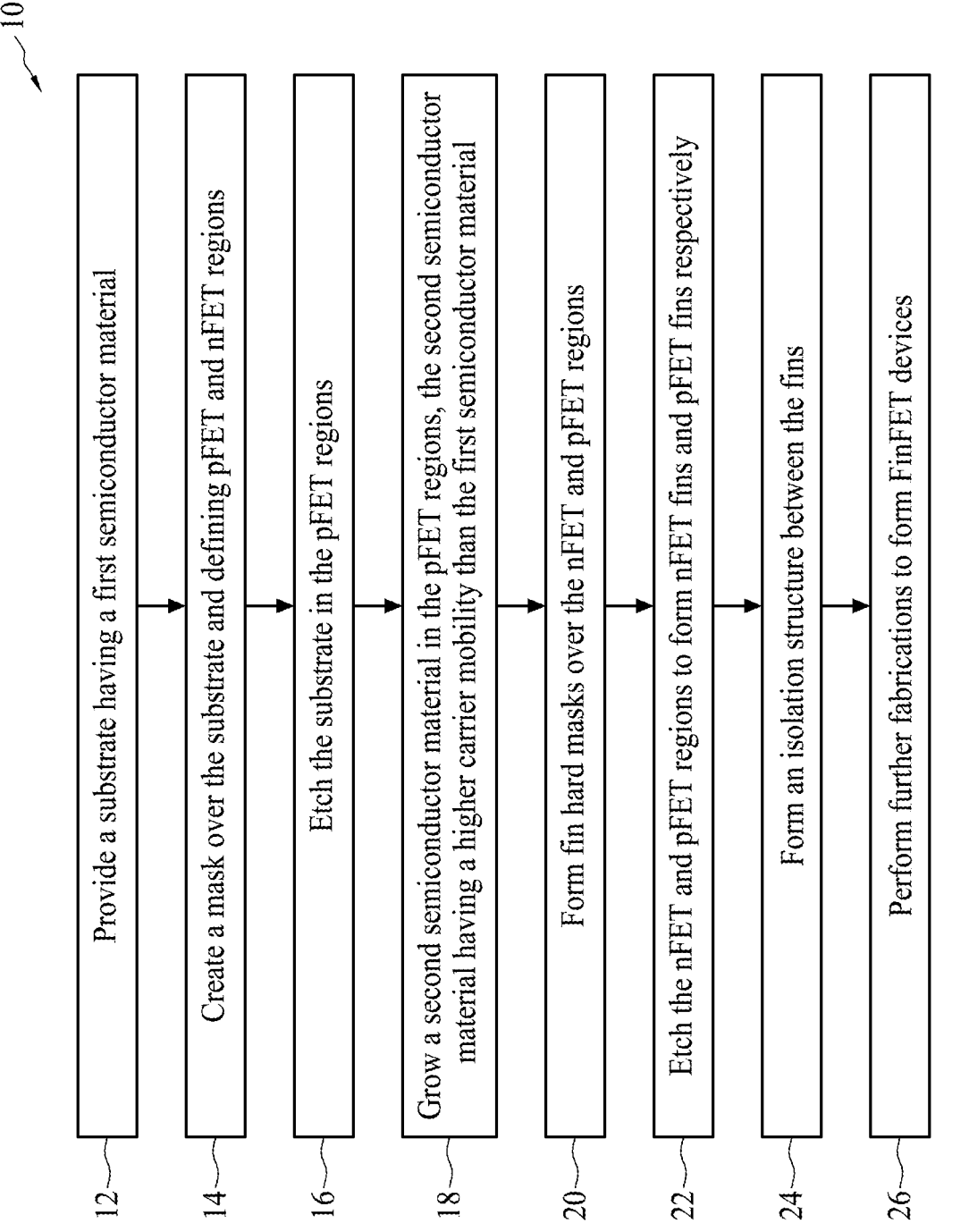

10

12 — Provide a substrate having a first semiconductor material

14 — Create a mask over the substrate and defining pFET and nFET regions

16 — Etch the substrate in the pFET regions

18 — Grow a second semiconductor material in the pFET regions, the second semiconductor material having a higher carrier mobility than the first semiconductor material 20 — Form fin hard masks over the nFET and pFET regions 22 — Etch the nFET and pFET regions to form nFET fins and pFET fins respectively 24 — Form an isolation structure between the fins 26 — Perform further fabrications to form FinFET devices

FIG. 1A

FIN HEIGHT AND STI DEPTH FOR PERFORMANCE IMPROVEMENT IN SEMICONDUCTOR DEVICES HAVING HIGH-MOBILITY P-CHANNEL TRANSISTORS

PRIORITY

This is a divisional application of U.S. patent application Ser. No. 17/158,522 filed Jan. 26, 2021, which claims the benefits to U.S. Provisional Application Ser. No. 63/065,189 filed Aug. 13, 2020 and U.S. Provisional Application Ser. No. 63/072,521 filed Aug. 31, 2020, the entire disclosures of which are incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

FinFET devices have been introduced to increase gate-channel coupling, reduce OFF-state current, and reduce short-channel effects (SCEs) over planar transistors. As the device downscaling continues, such as approaching 5 nm and 3 nm process nodes, traditional FinFET based on silicon also approaches its performance limitations. For example, aggressively-tight gate dimensions and tiny device volume make doping and strain engineering for performance very challenging for FinFET devices. Improvements for FinFET manufacturing is highly desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B show flow charts of a method of forming a semiconductor device, according to various aspects of the present disclosure.

DETAILED DESCRIPTION

Figure 1B:
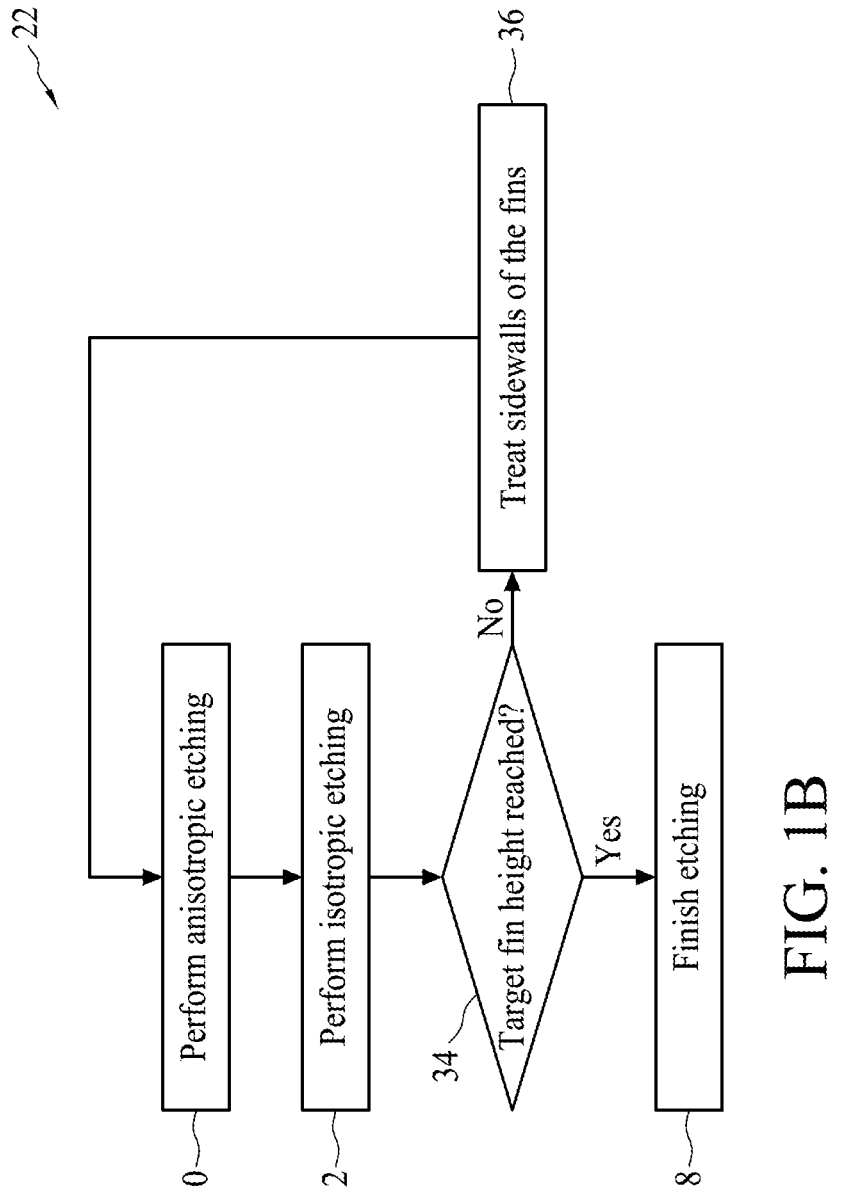

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/-10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to CMOS (complementary metal-oxide-semiconductor) devices with p-channel FinFET transistors and n-channel FinFET transistors. An object of the present disclosure is to provide methods of forming p-channel fins and n-channel fins on the same substrate where the n-channel fins include a first semiconductor material and the p-channel fins include a second semiconductor material that has a higher charge carrier (e.g., hole) mobility than the first semiconductor material. In an embodiment of the present disclosure, the first semiconductor material is single crystalline silicon and the second semiconductor material is silicon germanium alloy. In an embodiment, the p-channel fins are used for forming p-type FinFET and the n-channel fins are used for forming n-type FinFET. Using the p-channel fins further enhance the performance of the p-type FinFET over approaches where both n-type FinFET and p-type FinFET use the same material in their channels. Embodiments of the present disclosure also optimize the etching of p-channel fins and n-channel fins by the same etching processes, thereby forming the p-channel fins and n-channel fins to have closely matched critical dimensions and closely matched fin heights. This further improves the flatness of an isolation structure between the p-channel fins and the n-channel fins. The flatness of the isolation structure in turn improves subsequent fabrication processes such as gate formation. Those of ordinary skill in the art should appreciate that they may readily use the present disclosure as a basis for designing or modifying other processes and structures for carrying out the same purposes and/or achieving the same advantages of the embodiments introduced herein.

FIG. 1A is a flow chart of a method 10 for fabricating a semiconductor device according to various aspects of the present disclosure. Additional processing is contemplated by the present disclosure. Additional operations can be provided before, during, and after method 10, and some of the operations described can be moved, replaced, or eliminated for additional embodiments of method 10.

Method 10 is described below in conjunction with FIG. 2A through FIG. 11 that illustrate various views of a semiconductor device (or a semiconductor structure) 100 at various steps of fabrication according to the method 10, in accordance with some embodiments. In some embodiments, the device 100 is a portion of an IC chip, a system on chip (SoC), or portion thereof, that includes various passive and active microelectronic devices such as resistors, capacitors, inductors, diodes, p-type field effect transistors (PFETs or pFETs), n-type field effect transistors (NFETs or nFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2A through 11 have been simplified for the sake of clarity to better understand the inventive concepts of the present disclosure. Additional features can be added in the device 100, and some of the features described below can be replaced, modified, or eliminated in other embodiments of the device 100.

Figure 2B:
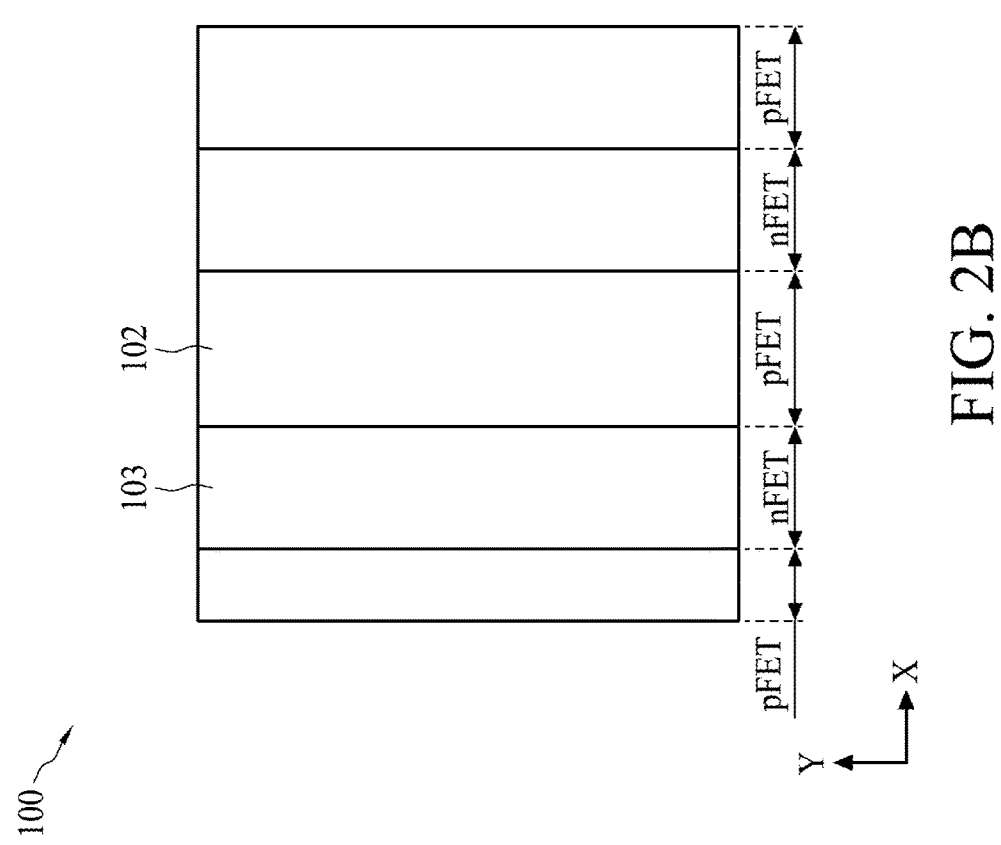
FIG. 2B illustrates a top view of a portion of a semiconductor device, according to some embodiments.
Figure 2A:
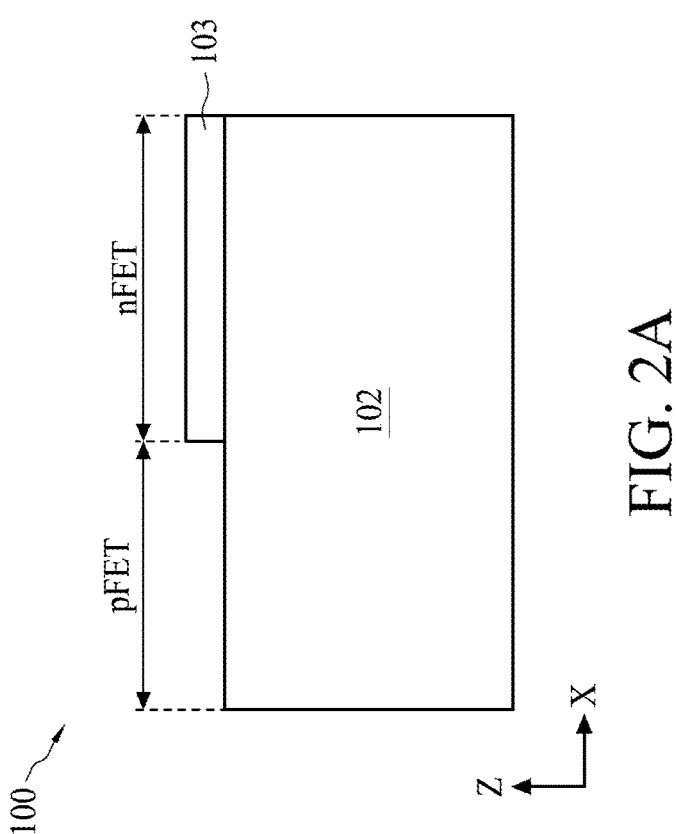
FIGS. 2A, 3, 4, 5A, 5B, 5C, 6, 7, 9B, 10, and 11 illustrate cross-sectional views of a portion of a semiconductor device, according to some embodiments, in intermediate steps of fabrication according to embodiments of the method of FIGS. 1A-1B.

At operation 12, the method 10 (FIG. 1A) provides or is provided with a substrate 102, such as shown in FIG. 2A. In the depicted embodiment, the substrate 102 is a silicon substrate, such as a silicon wafer having crystalline silicon. Alternatively, the substrate 102 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof.

At operation 14, the method 10 (FIG. 1A) forms a patterned mask 103 over the substrate 102, such as shown in FIGS. 2A and 2B. FIG. 2A illustrates the patterned mask 103 and the substrate 102 in a cross-sectional view in the "X-Z" plane while FIG. 2B illustrates the patterned mask 103 and the substrate 102 in a top view in the "X-Y" plane according to an embodiment. The patterned mask 103 covers the substrate 102 in nFET regions and exposes the substrate 102 in pFET regions. In the present disclosure, n-type transistors such as n-type FinFET will be formed in the nFET regions and p-type transistors such as p-type FinFET will be formed in the pFET regions. The n-type transistors and p-type transistors may be coupled to form CMOS devices. The patterned mask 103 is shown to have parallel rectangular strips in the present embodiment. In alternative embodiments, the patterned mask 103 may have other shapes and configurations. The patterned mask 103 may be formed using one or more photolithography processes, including double-patterning or multi-patterning processes. The patterned mask 103 may include silicon oxide, silicon nitride, photoresist, or other suitable materials in various embodiments.

Figure 3:
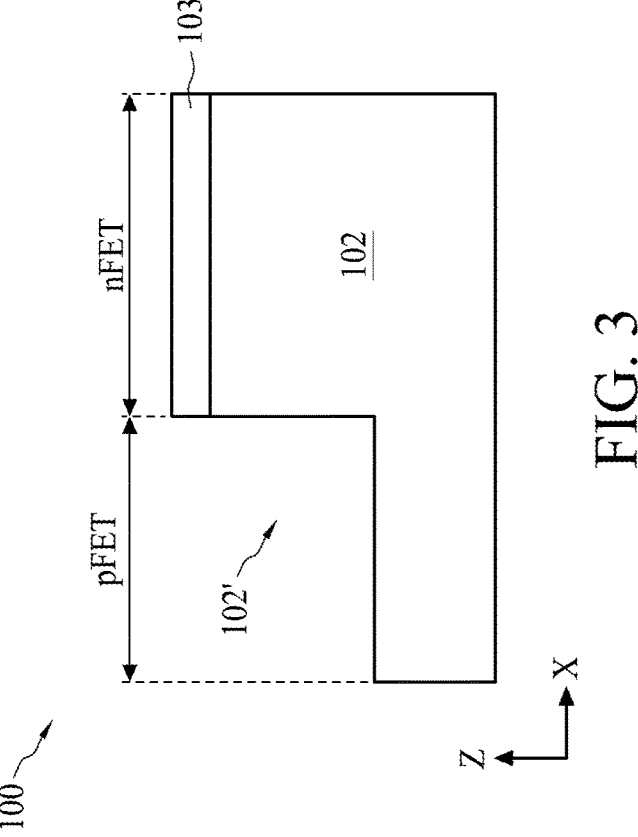

At operation 16, the method 10 (FIG. 1A) etches the substrate 102 through the patterned mask 103, thereby forming trenches 102' in the substrate 102, such as shown in FIG. 3 according to an embodiment. The trenches 102' (one shown in FIG. 3) are formed in the pFET regions, while the substrate 102 remains intact or substantially intact in the nFET regions under the patterned mask 103. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. In an embodiment, the etching process is anisotropic such that the boundary between the nFET regions and pFET regions can be well maintained during the operation 16. In some embodiments, the depth of the trenches 102' is controlled to be in a range of about 40 nm to about 70 nm from the top surface of the substrate 102 along the "Z" direction. This range is designed to provide proper semiconductor thickness for forming fins, as will be discussed later. In the present embodiment, the depth of the trench 102' can be controlled using a timer and depending on the etching rate of the material in the substrate 102 in the etching process.

Figure 4:
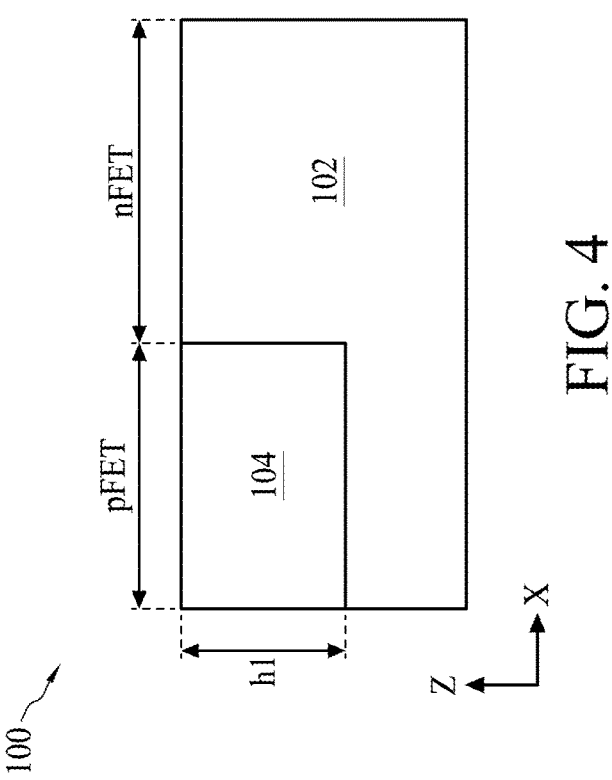

At operation 18, the method 10 (FIG. 1A) epitaxially grows a semiconductor material in the trenches 102', thereby forming a semiconductor layer 104 over the substrate 102 in the pFET regions such as shown in FIG. 4 according to an embodiment. In the present embodiment, the semiconductor material in the semiconductor layer 104 has higher charge carrier mobility (or simply, mobility) than the material in the substrate 102. In the present embodiment, the substrate 102 includes crystalline silicon and the semiconductor layer 104 includes silicon germanium (SiGe), which has higher hole mobility than crystalline silicon. This is suitable for creating high performance pFET in the pFET regions and high performance nFET in the nFET regions. In a further embodiment, the silicon germanium in the semiconductor layer 104 has a constant or near constant germanium atomic percent (at. %). In a further embodiment, the silicon germanium in the semiconductor layer 104 has a constant or near constant germanium atomic percent in a range from about 15 at. % to about 30 at. %. In other words, the semiconductor layer 104 includes $Si_{1-x}Ge_x$ where x is in the range of 15 at. % to 30 at. %. This range of Ge at. % is designed to provide proper performance enhancement when portions of the semiconductor layer 104 are used as FinFET transistor channels. In another embodiment, the semiconductor layer 104 includes silicon germanium (SiGe) having a gradient Ge at. %. For example, the Ge at. % in the semiconductor layer 104 may be gradually increased as the semiconductor layer 104 is grown to tune the crystal quality. In such example, when the growth of the semiconductor layer 104 finishes, the lower portion of the semiconductor layer 104 (near the substrate 102) has a lower Ge at. % than the upper portion of the semiconductor layer 104. In various embodiments, depending on the material in the substrate 102, the material in the semiconductor layer 104 may include silicon, germanium, silicon carbide, gallium nitride, gallium arsenide, gallium phosphide, indium phosphide, indium arsenide, and indium antimonide, silicon germanium, gallium arsenide phosphide, aluminum indium phosphide, aluminum gallium arsenide, gallium indium arsenide, gallium indium phosphide, gallium indium arsenide phosphide, or combinations thereof. In embodiments, epitaxial growth of the semiconductor layer 104 is achieved by a molecular beam epitaxy (MBE) process, a chemical vapor deposition (CVD) process, a meta-lorganic chemical vapor deposition (MOCVD) process, other suitable epitaxial growth process, or combinations thereof.

After the growth of the semiconductor layer 104 finishes, the operation 18 removes the patterned hard mask 103 and planarizes the top surface of the device 100, for example, using chemical mechanical planarization (CMP). As shown in FIG. 4, the top surface of the semiconductor layer 104 (in the pFET regions) and the top surface of the substrate 102 in the nFET regions are coplanar or substantially coplanar. The height (or thickness) h1 of the semiconductor layer 104 along the Z direction is in a range of about 40 nm to about 70 nm in an embodiment. This range of height is designed to provide sufficient sidewall surface areas for pFET fin channels, which is approximately twice of the product of the height h1 and the length of the fin channel (or the gate length Lg). It is also designed to provide a good aspect ratio for the pFET fins (which is the ratio of the height h1 to the width of the pFET fins) for robust manufacturability. If the height h1 is too small (such as less than 40 nm), the pFET fins resulting from the semiconductor layer 104 may not have sufficient surface areas for conducting current, which would lead to degraded pFET performance. If the height h1 is too large (such as more than 70 nm), the aspect ratio of the pFET fins resulting from the semiconductor layer 104 may be undesirably high and the pFET fins may be susceptible to collapsing during fabrication.

Figure 5B:
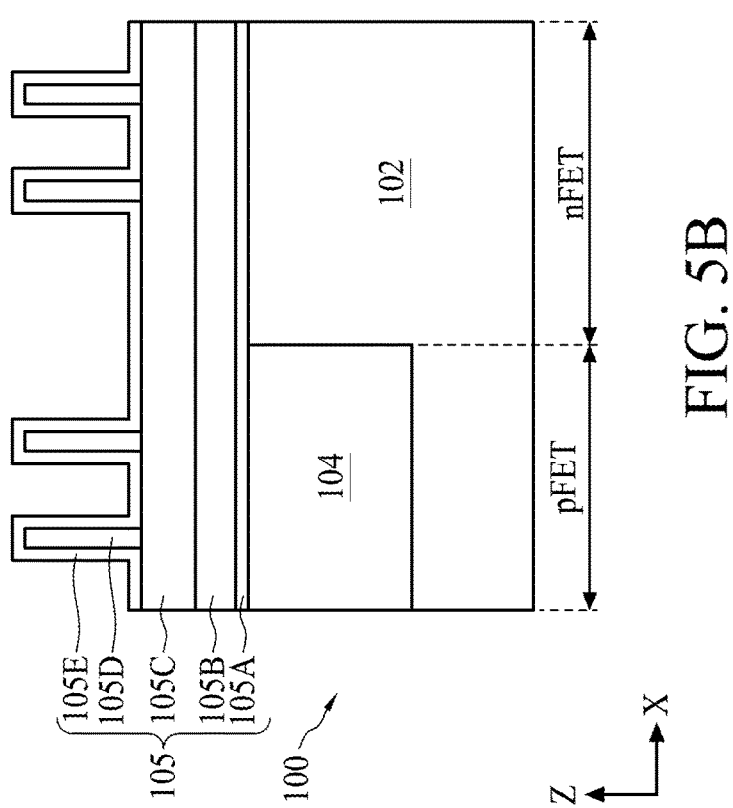
Figure 5A:
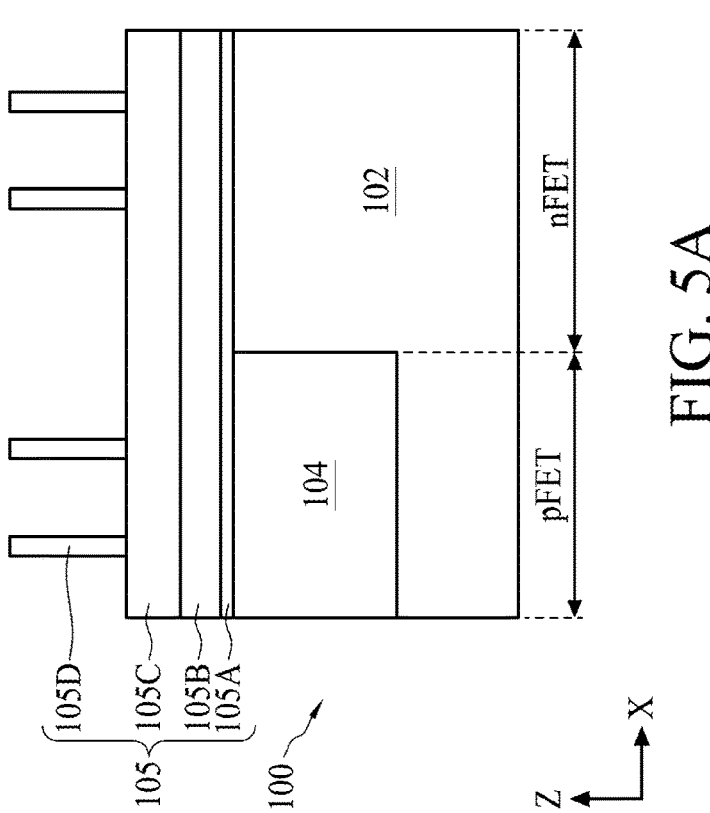
Figure 5C:
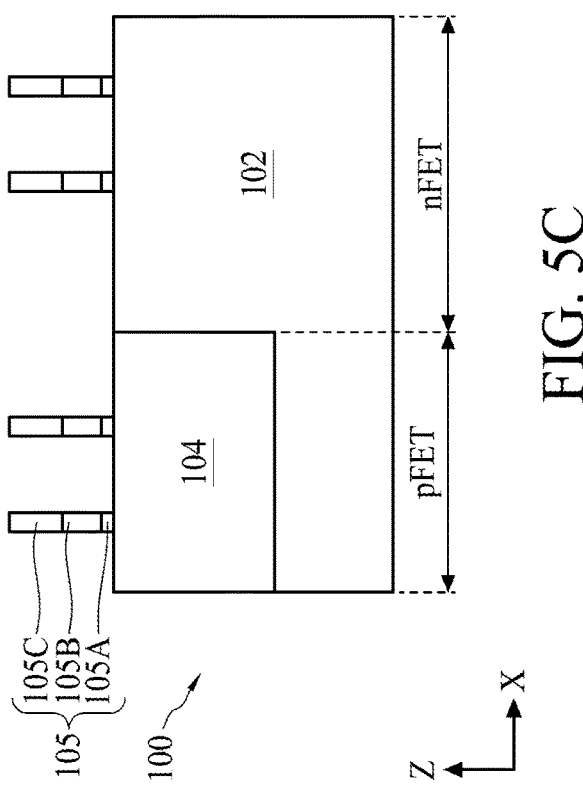

At operation 20, the method 10 (FIG. 1A) forms hard masks 105 that are used for etching the substrate 102 and the semiconductor layer 104 to form fins. The hard masks 105 are also referred to as fin hard masks 105. The operation 20 involves various steps that are illustrated in FIGS. 5A, 5B, and 5C. Referring to FIG. 5A, the operation 20 forms hard mask layers 105A, 105B, and 105C over the top surface of the substrate 102 and the semiconductor layer 104. In an embodiment, the hard mask layer 105A includes an oxide that may be formed by oxidizing the top surface of the substrate 102 and the semiconductor layer 104 or by deposition (such as chemical vapor deposition (CVD)); the hard mask layer 105B includes a nitride such as silicon nitride ($Si_3N_4$) that may be formed by CVD; and the hard mask layer 105C includes an oxide such as silicon dioxide ($SiO_2$) that may be formed by CVD. Still referring to FIG. 5A, the operation 20 further forms patterned masks 105D over the hard mask layer 105C. The patterned mask 105D may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the hard mask layer 105C and patterned using a photolithography process. Spacers are formed alongside the patterned sacrificial layer using a self-aligned process. The sacrificial layer is then removed, and the remaining spacers, or mandrels, become the patterned mask 105D. The patterned mask 105D may include silicon oxide, silicon nitride, or other suitable materials in various embodiments.

Referring to FIG. 5B, in some embodiments, the operation 20 forms a capping layer 105E over the patterned mask 105D and the hard mask layer 105C. In an embodiment, the capping layer 105E includes silicon nitride or other suitable materials and is deposited using atomic layer deposition (ALD). The thickness of the capping layer 105E is controlled to adjust the dimension of the combined hard mask 105 (for example, the combined dimension of the hard masks 105D and 105E along the "X" direction) to meet a target fin width. In some embodiments, the capping layer 105E is omitted in the operation 20. Referring to FIG. 5C, the hard mask layers 105C, 105B, and 105A are etched using the combined hard masks 105D and 105E as an etch mask, and the combined hard masks 105D and 105E are consumed by the etching processes or removed after the etching processes finish. At this stage, the fin hard masks 105 include the patterned hard masks 105A, 105B, and 105C.

Figure 6:
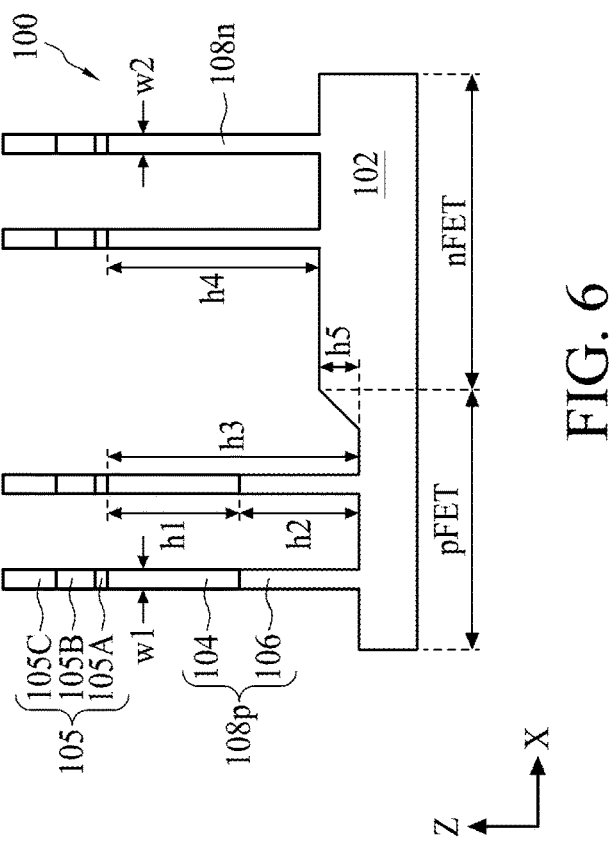

At operation 22, the method 10 (FIG. 1A) etches the substrate 102 and the semiconductor layer 104 to form nFET fins 108n in the nFET regions and pFET fins 108p in the pFET regions. The resultant structure is shown in FIG. 6 according to an embodiment. The fin hard masks 105 are used as etch masks when etching the substrate 102 and the semiconductor layer 104. An etching process that provides the same etching rate to both the semiconductor layer 104 and the substrate 102 is ideal for the operation 22 in order to produce the fins 108n and 108p to have the same dimensions. However, because the semiconductor layer 104 and the substrate 102 include different materials, they are typically etched at different rates in the same etching process in practice. For example, when the semiconductor layer 104 includes SiGe and the substrate 102 includes crystalline Si, the semiconductor layer 104 may be etched faster than the substrate 102 in typical dry etching processes. Thus, when a common etching process is used to etch the nFET and the pFET regions, the pFET fins 108p may be narrower and taller than the nFET fins 108n. When the difference between the dimensions (such as height and width) of the pFET fins 108p and nFET fins 108n is big (such as more than 30%), it introduces challenges to subsequent fabrication processes and may reduce the production yield. In the present embodiment, the operation 22 implements an iterative etching process that includes multiple steps of dry etching and chemical treatment so that the nFET fins 108n and the pFET fins 108p can be formed simultaneously and with closely matched dimensions (such as closely matched fin widths w1 and w2 along the "X" direction and closely matched fin heights h3 and h4 along the "Z" direction). This generally improves the production yield, while producing the fins 108n and 108p with acceptable matching dimensions (for example, the mismatch is less than 25%). Further, compared with approaches where the pFET fins 108p and nFET fins 108n are etched in separate etching processes (for example, forming a mask covering the pFET regions while etching the nFET regions and vice versa, which requires forming the fin hard masks 105 for nFET regions and pFET regions separately), the present embodiment saves manufacturing costs and produces the fin hard masks 105 with better pattern uniformity by forming the fin hard masks 105 using one photolithography process.

FIG. 1B illustrates a flow chart of the operation 22 using an iterative etching process according to an embodiment. Referring to FIG. 1B, the operation 22 includes a step 30 that performs anisotropic etching to the pFET regions and nFET regions simultaneously. In an embodiment, the anisotropic etching implements a dry etching process using HBr gas, $Cl_2$ gas, Ar gas, other suitable gases, or a mixture thereof. The gas flow rate, etching time, and other etching parameters (such as temperature and pressure) of the anisotropic etching are controlled to produce an initial structure of the pFET fins 108p and nFET fins 108n. For example, the step 30 may etch the pFET regions and nFET regions by a few nanometers deep. Then, the operation 22 proceeds to a step 32 that performs isotropic etching to the pFET regions and nFET regions simultaneously. In an embodiment, the isotropic etching implements a dry etching process using $NF_3$ gas, $CHF_3$ gas, $CF_4$ gas, other suitable gases, or a mixture thereof. The gas flow rate, etching time, and other etching parameters (such as temperature and pressure) of the isotropic etching are controlled to maintain good profiles in the fins 108n and 108p and to compensate, to certain degree, the different etching depth in the anisotropic etching (step 30) between the nFET regions and the pFET regions. Then, the operation 22 proceeds to a step 34 that checks (or monitors) the heights of the fins 108n and 108p. If the fins 108n and 108p have not reached a target fin height, the operation 22 proceeds to a step 36 that treats the sidewalls of the fins 108n and 108p with certain chemicals. For example, the step 36 may apply a treatment gas including $O_2$, $CO_2$, $SF_6$, $CH_3F$, other suitable gases, or a mixture thereof. The treatment produces some polymers on the sidewalls of the fins 108n and 108p to help control the profile the fins 108n and 108p during subsequent etching processes. After the treatment finishes, the operation 22 proceeds to the step 30 to start another iteration of the anisotropic and the isotropic etching processes. The operation 22 may repeat the steps 30, 32, 34, and 36 until the fins 108n and 108p reach a target fin height.

In an embodiment, even with the iterative etching processes implemented in the operation 22, the fins 108n and 108p may still end up with slightly different heights (for example, the fin heights are within 25% of each other). The regions that are etched slower than the other regions in the operation 22 control when to stop the operation 22. For example, when the substrate 102 include crystalline Si and the semiconductor layer 104 includes SiGe, the nFET regions are etched slower than the pFET regions. Thus, the operation 22 in the step 34 uses the height of the nFET fins 108n as the control. In other words, when the step 34 determines that the height of the nFET fins 108n has reached the target fin height, the operation 22 proceeds to the step 38 to finish etching. The step 38 may also perform a cleaning process to the fins 108n and 108p. Since the pFET regions are etched faster, the pFET fins 108p end up being slightly taller than the nFET fins in the embodiment depicted in FIG. 6.

Referring to FIG. 6, each nFET fin 108n has a width w2 along the "X" direction and a height h4 along the "Z" direction from the top surface of the remaining substrate 102 to the bottom surface of the fin hard mask 105. The nFET fins 108n are resulted from etching the substrate 102 by the operation 22, thus have the same material as the substrate 102. Each pFET fin 108p has a width w1 along the "X" direction and a height h3 along the "Z" direction from the top surface of the remaining substrate 102 to the bottom surface of the fin hard mask 105. Each pFET fin 108p includes a top portion resulted from etching the semiconductor layer 104 by the operation 22 and a bottom portion resulted from etching the substrate 102 by the operation 22. For the convenience of discussion, the top portion of the pFET fin 108p is referred to as the top portion 104 and the bottom portion of the pFET fin 108p is referred to as the bottom portion 106. The top portion 104 has the same material as the semiconductor layer 104, and the bottom portion 106 has the same material as the substrate 102. The top portion 104 has a height h1, the bottom portion 106 has a height h2, and the height h3 is the sum of the height h1 and the height h2. Because the pFET regions are etched faster in this embodiment, the top surface of the remaining portion of the substrate 102 in the pFET region is lower than the top surface of the remaining portion of the substrate 102 in the nFET region by a step height h5. Even though FIG. 6 depicts two nFET fins 108n adjacent to two pFET fins 108p, the present disclosure is not so limited. In various embodiments, there may be one or more nFET fins 108n in an nFET region and one or more pFET fins 108p in a pFET region.

In the present embodiment, the nFET fins 108n and the bottom portion 106 of the pFET fins 108p include crystalline Si and the top portion 104 of the pFET fins 108p include SiGe. The width w2 may be slightly larger than the width w1, for example, by about 5% to about 10%, because SiGe is etched faster than Si in the operation 22. For example, the width w1 may be in a range of about 6.1 nm to about 7.1 nm and the width w2 may be in a range of about 6.5 nm to about 7.5 nm. These ranges of fin widths are designed in consideration of proper gate-channel control when these fins are used as FinFET channels. Further, the height h1 is in a range of about 40 nm to about 70 nm as discussed with reference to FIG. 4. The height h4 is in a range of about 100 nm to about 115 nm in an embodiment. As will be discussed, the height h4 can be different among the nFET fins 108n depending on the pitch (or center-to-center distance) between the adjacent nFET fins 108n. This range is designed to provide sufficient fin sidewall surface areas for conducting current and to provide a robust aspect ratio (h4:w2) for the manufacturability of the nFET fins 108n. The height h3 is greater than the height h4 because SiGe is etched faster than Si in the operation 22. In the present embodiment, the height h3 is slightly greater than the height h4 due to the iterative etching and treating processes implemented in the operation 22. For example, the height h3 is greater than the height h4 by 25% or less such as by 20% or less. For example, the height h3 may be in a range of about 115 nm to about 125 nm in an embodiment. Further, the step height h5 may be in a range of about 10 nm to about 30 nm in various embodiments. The operation 22 may be tuned to minimize the step height h5.

Figure 7:
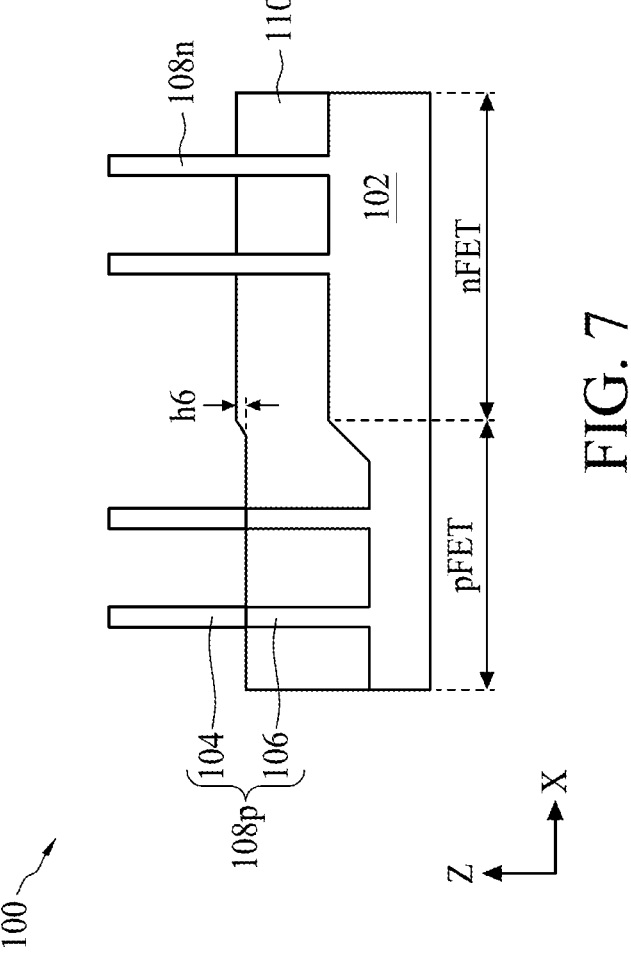

At operation 24, the method 10 (FIG. 1A) forms an isolation structure 110 over the remaining portions of the substrate 102 and laterally isolating the various fins 108n and 108p. The resultant structure is shown in FIG. 7 according to an embodiment. For example, the isolation structure 110 surrounds a bottom portion of fins 108n and 108p to separate and isolate fins 108n and 108p from each other. The isolation structure 110 may include silicon oxide, silicon nitride, silicon oxynitride, other suitable isolation material (for example, including silicon, oxygen, nitrogen, carbon, or other suitable isolation constituent), or combinations thereof. The isolation structure 110 can include different structures, such as shallow trench isolation (STI) structures and/or deep trench isolation (DTI) structures. In some embodiments, the isolation structure 110 include a multi-layer structure. For example, the isolation structure 110 may include a thermally formed oxide liner layer on surfaces of the substrate 102 and the fins 108n and 108p, and a silicon nitride layer disposed over the oxide liner layer. In an embodiment, the isolation structure 110 is formed by filling the trenches between fins 108n and 108p with one or more insulator materials (for example, by using a CVD process or a spin-on glass process); performing a chemical mechanical polishing (CMP) process to remove excessive insulator materials, remove the fin hard masks 105, and/or planarize a top surface of the insulator materials, and etching back the insulator materials to form the isolation structure 110. In the present embodiment, the etching back of the isolation structure 110 is controlled such that the top surface of the isolation structure 110 in the pFET region is even with or slightly above the bottom surface of the top portion 104 of the pFET fins 108*p*. Due to the step profile in the substrate 102, the top surface of the isolation structure 110 may also has a step. In other words, the top surface of the isolation structure 110 in the nFET regions may be slightly higher than the top surface of the isolation structure 110 in the pFET regions by a step height h6. In some embodiments where the height h5 is in a range of about 10 nm to about 30 nm, the height h6 is in a range of about 1 nm to about 6 nm. Such range of the height h6 is generally within the desired range for the interests of good production yield. The operation 22 may be tuned to minimize the step height h5, which leads to minimizing the step height h6.

Figure 8:
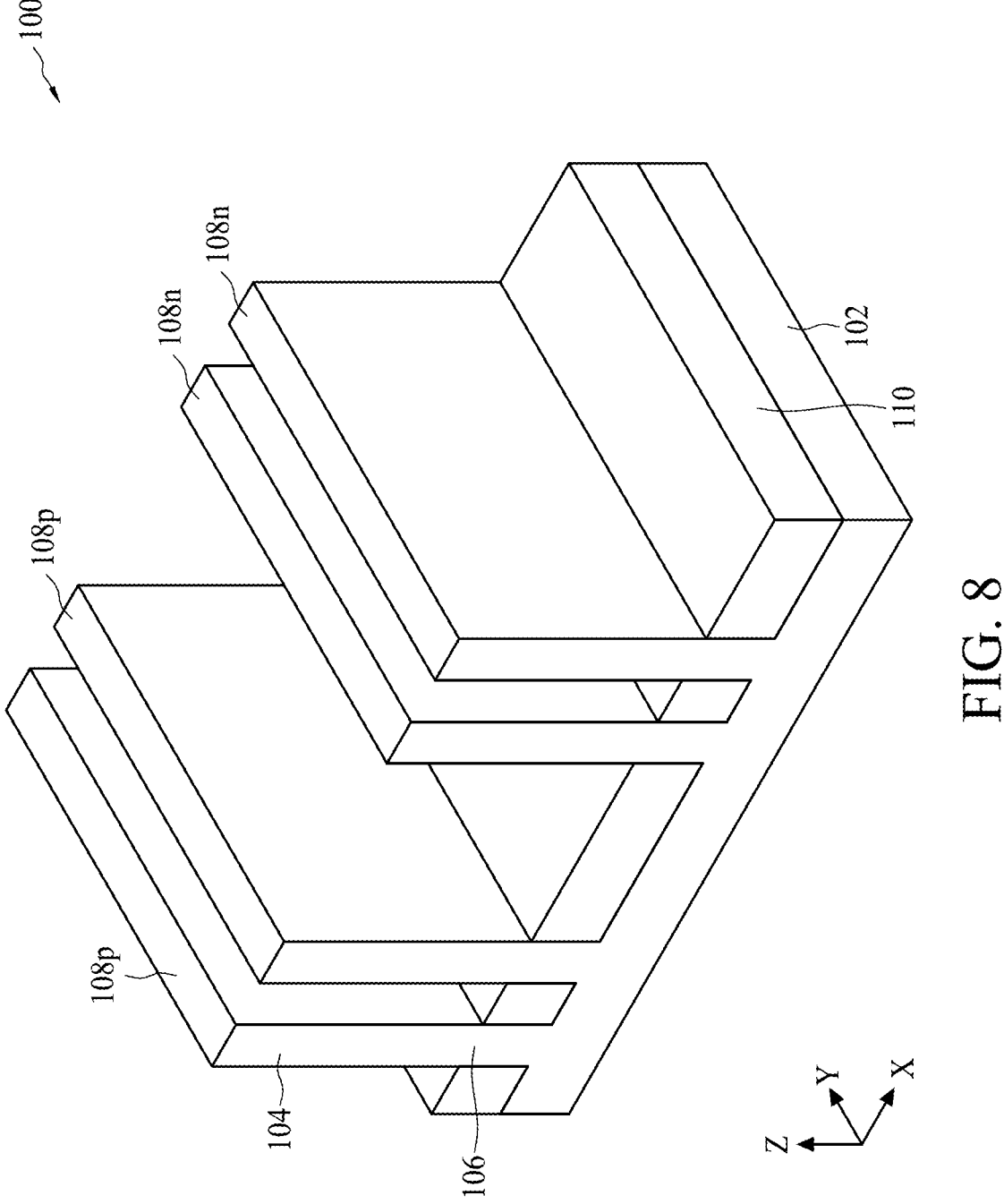
FIGS. 8 and 9A illustrate perspective views of a portion of a semiconductor device, according to some embodiments.
Figure 9A:
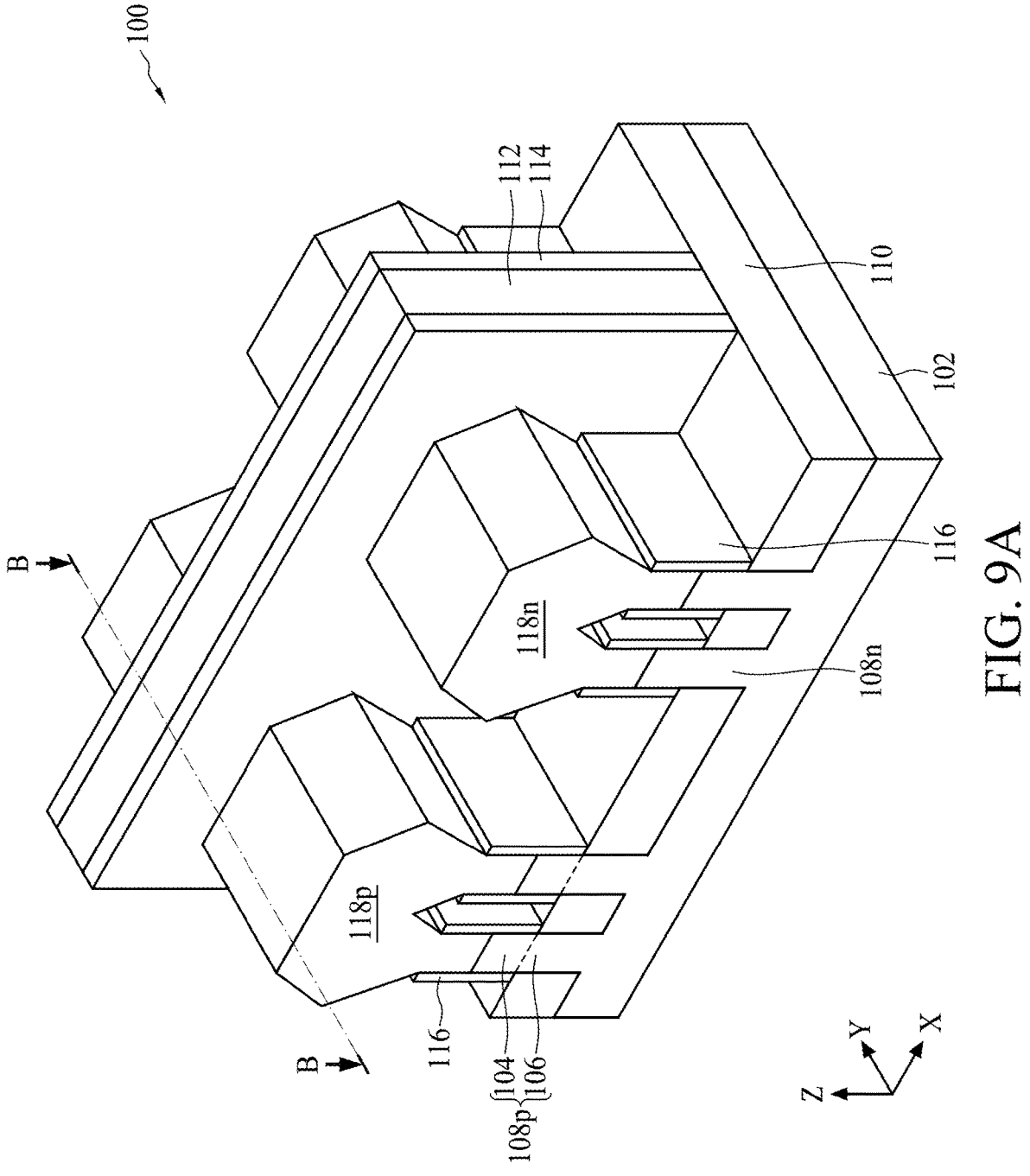
Figure 9B:
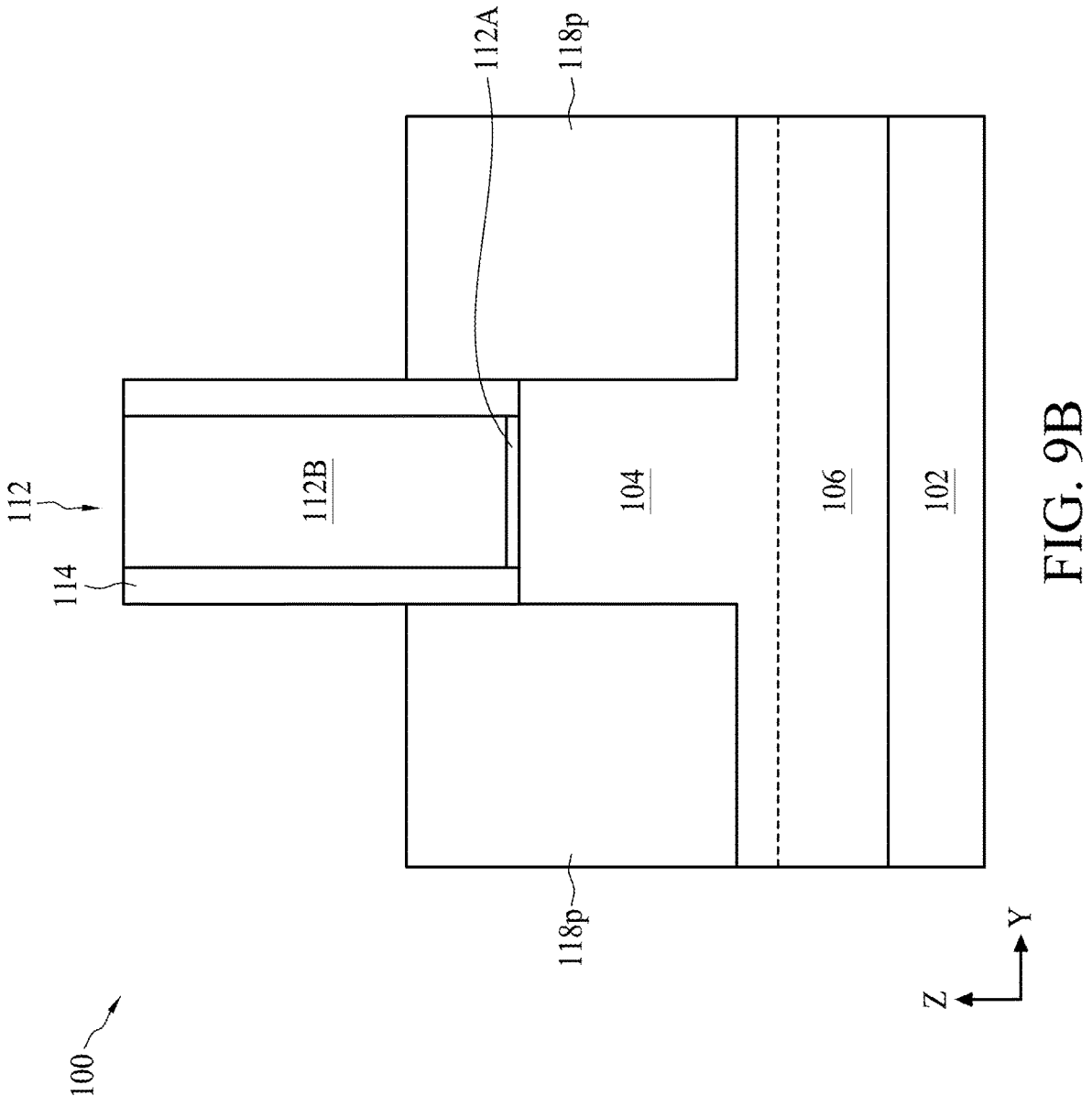

At operation 26, the method 10 (FIG. 1A) proceeds to further fabrication steps to form FinFET devices over the nFET fins 108*n* and pFET fins 108*p*. For example, the operation 26 may form dummy gates over the fins 108*n* and 108*p*, form source/drain regions by etching the fins 108*n* and 108*p* in the source/drain regions and epitaxially growing source/drain features over remaining portions of the fins 108*n* and 108*p* in the source/drain regions, replace the dummy gates with high-k metal gates, form inter-layer dielectric layer, form contacts to the source/drain features and high-k metal gates, form multi-level interconnect structures, and perform other fabrications. In that regard, FIG. 8 illustrates a perspective view of the device 100 after the operation 24 finishes, which shows two nFET fins 108*n* and two pFET fins 108*p* extending from the substrate 102 and through the isolation structure 110. Each of the pFET fins 108*p* includes a top portion 104 and a bottom portion 106. FIG. 9A illustrates a perspective view of the device 100 after further fabrication is performed to the device 100 in the operation 26, according to an embodiment. FIG. 9B illustrates a cross-sectional view of the device 100 along the "B-B" line in FIG. 9A. As illustrated in FIGS. 9A and 9B, the operation 26 forms n-type FinFET over the nFET fins 108*n* and p-type FinFET over the pFET fins 108*p*, where portions of the fins 108*n* and 108*p* function as the channels for the respective FinFET. In the embodiment shown in FIGS. 9A and 9B, a common high-k metal gate 112 engages the fins 108*n* and 108*p* to form a CMOS device. In alternative embodiments, the n-type FinFET and the p-type FinFET may have separate high-k metal gates.

Referring to FIGS. 9A and 9B, in this embodiment, the device 100 includes a high-k metal gate 112, gate spacers 114 on sidewalls of the high-k metal gate 112, fin sidewall spacers 116, n-type source/drain features 118*n* over a remaining portion of the fin 108*n* (after a source/drain trench etching process), and p-type source/drain features 118*p* over a remaining portion of the fin 108*p* (after a source/drain trench etching process). The device 100 may include various other elements not shown in FIGS. 9A and 9B. Referring to FIG. 9B, in the p-type FinFET, the high-k metal gate 112 is disposed over the top portion 104 of the pFET fin 108*p* which provides high charge carrier mobility. The top portion 104 of the pFET fin 108*p* connects the two p-type source/drain features 118*p* and functions as the transistor channel. Because the top portion 104 uses a high-mobility semiconductor material, the performance of the p-type FinFET is improved. In the present embodiment, the top portion 104 of the pFET fins 108*p* is partially etched in the source/drain regions and the source/drain features 118*p* are disposed directly on remaining portions of the top portion 104 in the source/drain region. In an alternative embodiment, the top portion 104 of the pFET fins 108*p* is fully etched in the source/drain regions and the source/drain features 118*p* are disposed directly on the bottom portion 106 in the source/drain region.

The source/drain features 118*n* and 118*p* may be formed by any suitable epitaxy process, such as vapor phase epitaxy, molecular beam epitaxy, other suitable epitaxial growth processes, or combinations thereof. In some embodiments, the source/drain features 118*n* include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, the source/drain features 118*p* include silicon germanium or germanium and can be doped with boron, other p-type dopant, or combinations thereof (for example, forming Si:Ge:B epitaxial source/drain features). In some embodiments, epitaxial source/drain features 118*n* and 118*p* are doped during deposition by adding impurities to a source material of the epitaxy process (i.e., in-situ). In some embodiments, epitaxial source/drain features 118*n* and 118*p* are doped by an ion implantation process subsequent to a deposition process. In some embodiments, annealing processes (e.g., rapid thermal annealing (RTA) and/or laser annealing) are performed to activate dopants in the epitaxial source/drain features 118*n* and 118*p*. In some embodiments, epitaxial source/drain features 118*n* and 118*p* are formed in separate processing sequences that include, for example, masking pFET regions when forming epitaxial source/drain features 118*n* in nFET regions and masking nFET regions when forming epitaxial source/drain features 118*p* in pFET regions.

In an embodiment, the high-k metal gate 112 includes a high-k gate dielectric layer 112A and a gate electrode layer 112B. The gate electrode layer 112B may include a work function layer and a bulk metal layer. The high-k metal gate 112 may include additional layers such as a dielectric interfacial layer between the top portion 104 and the high-k gate dielectric layer 112A. In various embodiments, the dielectric interfacial layer may include a dielectric material such as silicon oxide, silicon oxynitride, or silicon germanium oxide, and may be formed by chemical oxidation, thermal oxidation, atomic layer deposition (ALD), chemical vapor deposition (CVD), and/or other suitable methods. The dielectric interfacial layer may include different dielectric materials for n-type FinFET and for p-type FinFET. For example, the dielectric interfacial layer may include silicon oxide for n-type FinFET and silicon germanium oxide for p-type FinFET. The high-k gate dielectric layer 112A may include hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof; and may be formed by ALD and/or other suitable methods. The work function layer (part of the gate electrode layer 112B) may include a metal selected from but not restricted to the group of titanium aluminum nitride (TiAlN), titanium nitride (TiN), tantalum nitride (TaN), ruthenium (Ru), molybdenum (Mo), tungsten (W), platinum (Pt), aluminum (Al), or combinations thereof; and may be deposited by CVD, PVD, and/or other suitable process. The bulk metal layer (part of the gate electrode layer 112B) may include a metal such as aluminum (Al), tungsten (W), cobalt (Co), copper (Cu), and/or other suitable materials; and may be deposited using plating, CVD, PVD, or other suitable processes.

Each of the fin sidewall spacers 116 and the gate spacers 114 may be a single layer or multi-layer structure. In some embodiments, each of the spacers 116 and 114 includes a dielectric material, such as silicon oxide ($SiO_2$), silicon nitride ($Si_3N_4$), silicon oxynitride (SiON), other dielectric material, or combination thereof. In an example, the spacers 116 and 114 are formed by depositing a first dielectric layer (e.g., a $SiO_2$ layer having a substantially uniform thickness) as an liner layer over the device 100, and a second dielectric layer (e.g., a $Si_3N_4$ layer) as a main D-shaped spacer over the first dielectric layer, and then, anisotropically etching to remove portions of the dielectric layers to form the spacers 116 and 114. Additionally, the fin sidewall spacers 116 may be partially removed during the etching process that forms recesses into the fins 108n and 108p prior to growing the source/drain features 118n and 118p. In some embodiments, the fin sidewall spacers 116 may be completely removed by such etching process.

Figure 10:
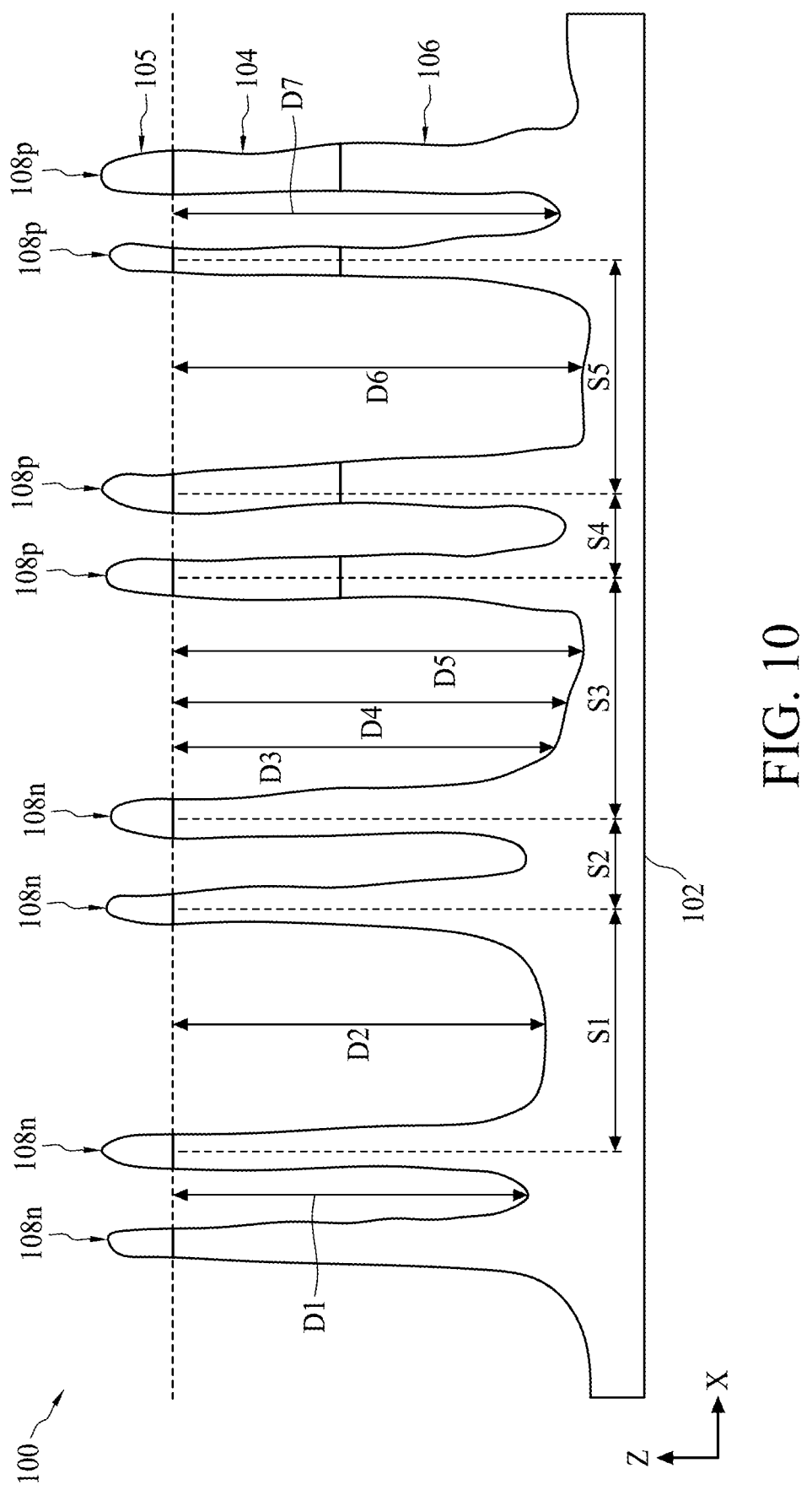

FIG. 10 illustrates a cross-sectional view of a portion of the device 100 according to an embodiment. For example, the portion of the device 100 in FIG. 10 may be a portion of a ring oscillator circuit, where high performance p-type FinFET can be used to boost the performance of the circuit. Referring to FIG. 10, the device 100 includes dual nFET fins 108n and dual pFET fins 108p in a repeating pattern. More specifically, the device 100 includes a repeating pattern of a pair of nFET fins 108n, another pair of nFET fins 108n, a pair of pFET fins 108p, and another pair of pFET fins 108p. In some embodiments, the two nFET fins 108n in the same pair are used for forming a single n-type FinFET, and the two pFET fins 108p in the same pair are used for forming a single p-type FinFET. The pitch (center-to-center distance) between two nFET fins 108n in the same pair is S2, and the pitch between two pFET fins 108p in the same pair is S4. In an embodiment, S4 is substantially equal to S2. The center-to-center distance between an nFET fin 108n and another nFET fin 108n of two adjacent pairs is S1. The center-to-center distance between a pFET fin 108p and another pFET fin 108p of two adjacent pairs is S5. The center-to-center distance between an nFET fin 108n and a pFET fin 108p of two adjacent pairs is S3. In an embodiment, the distances S1, S3, and S5 are substantially the same. FIG. 10 also illustrates various depths D1, D2, D3, D4, D5, D6, and D7, each of which is measured from the top surface of the fins 108n/108p to the top surface of the substrate 102 after the operation 22 finishes. The depth D1 is measured between two nFET fins 108n of the same pair. The depth D2 is measured between two adjacent pairs of nFET fins 108n. The depths D3, D4, and D5 are measured at various points between a pair of nFET fins 108n and a pair of pFET fins 108p. The depth D6 is measured between two adjacent pairs of pFET fins 108p. The depth D7 is measured between two pFET fins 108p of the same pair.

FIG. 10 illustrates the impact of the spacing S1 through S5 upon the depths D1 through D7. Specifically, when two fins in the same device region (both in nFET regions or both in pFET regions) are closer, a depth of etching between the two fins is smaller. For example, each of the spacing S1 and S5 is greater than the spacing S2 and S4, and each of the depths D2 and D6 is greater than the depths D1 and D7. Further, even though S2 and S4 are substantially the same, the depth D7 is greater than the depth D1 because the semiconductor layer 104 is etched at a faster rate than the substrate 102 as discussed above. In some embodiments, the depth D7 is greater than the depth D1 by about 25% or less, such as about 5% to about 20%. For the same reason, even though S1 and S5 are substantially the same, the depth D6 is greater than the depth D2. In some embodiments, the depth D6 is greater than the depth D2 by about 25% or less, such as about 5% to about 20%. The difference between D6 and D2 represents the step height h5 (FIG. 6) for this embodiment. The depths D3, D4, and D5 gradually increase one over another as the measurement point moves from the nFET fin 108n towards the pFET fin 108p. In other words, D4 is greater than D3, and D5 is greater than D4. Further, in this embodiment, the depth D2 is equal to or less than the depth D3, and the depth D5 is equal to or smaller than the depth D6. The gradual change of the depths from D3 to D5 represents the step between an nFET region and a pFET region as shown in FIG. 6.

In an embodiment, the width of the pFET fins 108p is in a range of about 6.1 nm to about 7.1 nm and the width of the nFET fins 108n is greater than the width of the pFET fins 108 and may be in a range of about 6.5 nm to about 7.5 nm. These ranges of fin width are designed to achieve desirable FinFET performance such as DIBL (drain induced barrier lowering) as well as to increase fin density. Further, each of S2 and S4 is in a range of about 23 nm to about 28 nm and each of S1, S3, and S5 is in a range of about 68 nm to about 73 nm. These ranges of spacing are designed to increase fin (or device) density while avoiding fin to fin bridging problems. Still further, the depth D1 is in a range of about 100 nm to about 105 nm; the depth D2 is in a range of about 101 nm to about 106 nm; the depth D3 is in a range of about 105 nm to about 110 nm; the depth D4 is in a range of about 113 nm to about 118 nm; each of the depths D5 and D6 is in a range of about 120 nm to about 125 nm; and the depth D7 is in a range of about 115 nm to about 120 nm. These ranges of depths achieve good depth uniformity, which provides good topography when performing CMP on the isolation structure 110.

Figure 11:
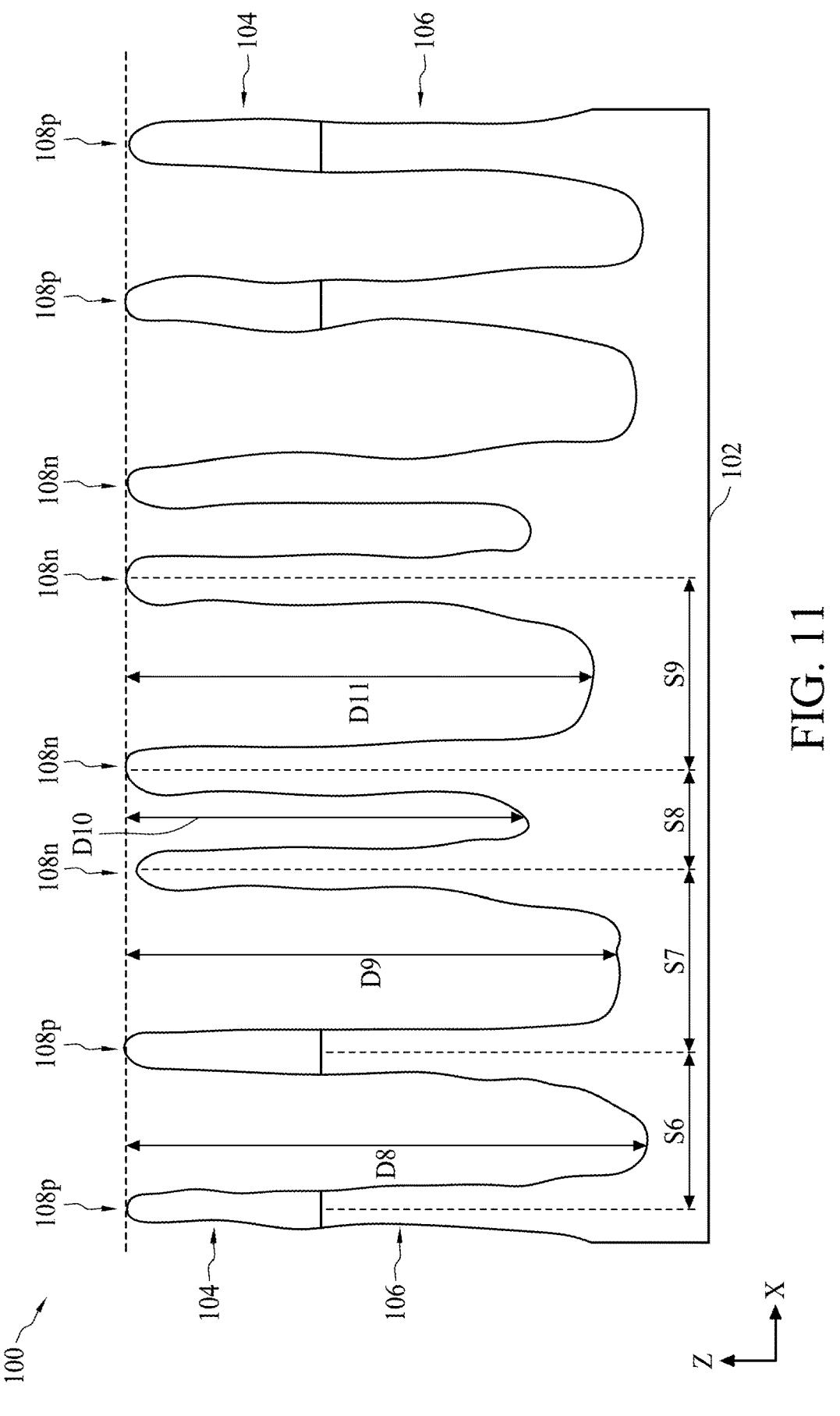

FIG. 11 illustrates a cross-sectional view of a portion of the device 100 according to another embodiment. For example, the portion of the device 100 in FIG. 11 may be a portion of an SRAM circuit, where high performance p-type FinFET can be used to boost the performance of the circuit. Referring to FIG. 11, the device 100 includes dual nFET fins 108n and single pFET fins 108p in a repeating pattern. More specifically, the device 100 includes a repeating pattern of a single pFET fin 108p, another single pFET fin 108p, a pair of nFET fins 108n, another pair of nFET fins 108n, a single pFET fin 108p, and another single pFET fin 108p. In some embodiments, the two nFET fins 108n in the same pair are used for forming a single n-type FinFET, and each pFET fin 108p is used for forming a single p-type FinFET. The pitch (center-to-center distance) between two nFET fins 108n in the same pair is S8, the pitch between two adjacent pFET fins 108p is S6, the pitch between a pFET fin 108p and an adjacent nFET fin 108n is S7, and the pitch between two nFET fins 108n of two adjacent pairs is S9. In an embodiment, S7 is substantially equal to S9, and S8 is less than S6 that is less than S7. FIG. 11 also illustrates various depths D8, D9, D10, and D11, each of which is measured from the top surface of the fins 108n/108p to the top surface of the substrate 102 after the operation 22 finishes. The depth D8 is measured between two adjacent pFET fins 108p. The depth D9 is measured between a pFET fin 108p and an adjacent nFET fin 108n. The depth D10 is measured between two nFET fins 108n of the same pair. The depth D11 is measured between two adjacent pairs of nFET fins 108n.

FIG. 11 illustrates the impact of the spacing S6 through S9 upon the depths D8 through D11. Specifically, when two fins in the same device region (both in nFET regions or both in pFET regions) are closer, a depth of etching between the two fins is smaller. For example, the spacing S9 is greater than the spacing S8, and the depth D11 is greater than the depth D10 (both are measured between nFET fins 108*n*). Further, even though S7 and S9 are substantially the same, the depth D9 is greater than the depth D11 because the depth D9 is between a pFET fin 108*p* and an nFET fin 108*n* and the semiconductor layer 104 is etched at a faster rate than the substrate 102 as discussed above. Still further, the depth D8 may be greater than, equal to, or less than the depth D9 in various embodiments depending on the spacing S6 and S7. When the spacing S6 is about equal to the spacing S7 (for example, within 10% of each other), the depth D8 may be equal to or greater than the depth D9 because the depth D8 is measured between two pFET fins 108*p* and the depth D9 is measured between a pFET fin 108*p* and an nFET fin 108*n*. In some embodiments, the depth D11 is greater than the depth D10 by about 10% or less. In some embodiments, the depth D8 is greater than the depth D11 by about 20% or less, such as about 5% to about 12%. The difference between D8 and D11 represents the step height h5 (FIG. 6) for this embodiment.

In an embodiment, the width of the pFET fins 108*p* is in a range of about 6.1 nm to about 7.1 nm and the width of the nFET fins 108*n* is greater than the width of the pFET fins 108 and may be in a range of about 6.5 nm to about 7.5 nm. These ranges of fin width are designed to achieve desirable FinFET performance such as DIBL (drain induced barrier lowering) as well as to increase fin density. Further, the spacing S6 is in a range of about 33 nm to about 38 nm; the spacing S7 is in a range of about 40 nm to about 45 nm; the spacing S8 is in a range of about 23 nm to about 28 nm; and the spacing S9 is in a range of about 40 nm to about 45 nm. These ranges of spacing are designed to increase fin (or device) density while avoiding fin to fin bridging problems. Still further, the depth D8 is in a range of about 120 nm to about 125 nm; the depth D9 is in a range of about 117 nm to about 122 nm; the depth D10 is in a range of about 100 nm to about 105 nm; and the depth D11 is in a range of about 108 nm to about 113 nm. These ranges of depths achieve good depth uniformity, which provides good topography when performing CMP on the isolation structure 110.

Although not intended to be limiting, embodiments of the present disclosure provide one or more of the following advantages. For example, embodiments of the present disclosure form pFET fins and nFET fins over the same substrate where the pFET fins include a material that has higher hole mobility than the material in the nFET fins. This improves the performance of p-type FinFET formed from the pFET fins. Further, embodiments of the present disclosure etch for the pFET fins and nFET fins using a common process that implements iterative etching and treatment. Such process reduces or minimizes the difference in the dimensions of the pFET fins and nFET fins and leads to good planarity of a subsequently formed isolation structure. Embodiments of the present disclosure can be readily integrated into existing semiconductor manufacturing processes.

In one example aspect, the present disclosure is directed to a method that includes providing a substrate having a first semiconductor material; creating a mask that covers an nFET region of the substrate; etching a pFET region of the substrate to form a trench; epitaxially growing a second semiconductor material in the trench, wherein the second semiconductor material is different from the first semiconductor material; and patterning the nFET region and the pFET region to produce a first fin in the nFET region and a second fin in the pFET region, wherein the first fin includes the first semiconductor material and the second fin includes a top portion over a bottom portion, wherein the top portion includes the second semiconductor material, and the bottom portion includes the first semiconductor material.

In an embodiment of the method, the substrate is a silicon substrate and the second semiconductor material includes silicon germanium. In an embodiment, the method further includes planarizing a top surface of the nFET region and the pFET region after the epitaxially growing of the second semiconductor material.

In an embodiment, the patterning of the nFET region and the pFET region includes forming fin hard masks over the nFET region and the pFET region and etching the nFET region and the pFET region through the fin hard masks by a same process to produce the first and the second fins. In a further embodiment, the etching of the nFET region and the pFET region includes anisotropically etching the nFET region and the pFET region through the fin hard masks; after the anisotropically etching, isotropically etching the nFET region and the pFET region through the fin hard masks; treating a structure resulted from the anisotropically etching and the isotropically etching with a treatment gas mixture; and repeating the anisotropically etching, the isotropically etching, and the treating to produce the first fin in the nFET region and the second fin in the pFET region, wherein the anisotropically etching, the isotropically etching, and the treating apply different gases. In some embodiments, the anisotropically etching includes applying HBr, $Cl_2$, Ar, or a mixture thereof. In some embodiments, the isotropically etching includes applying $NF_3$, $CHF_3$, $CF_4$, or a mixture thereof. In some embodiments, the treating includes applying $O_2$, $CO_2$, $SF_6$, $CH_3F$, or a mixture thereof.

In an embodiment, the method further includes forming an isolation structure between the first fin and the second fin, wherein a first bottom surface of the isolation structure adjacent to the first fin is higher than a second bottom surface of the isolation structure adjacent to the second fin by about 10 nm to about 30 nm.

In another example aspect, the present disclosure is directed to a structure that includes a substrate; a first fin extending from the substrate; and a second fin extending from the substrate. The second fin includes a top portion over a bottom portion. The first fin and the bottom portion of the second fin include crystalline silicon. The top portion of the second fin includes a semiconductor material that has a higher charge carrier mobility than silicon. A top surface of the second fin and a top surface of the first fin are substantially coplanar. The bottom portion of the second fin extends deeper than the first fin towards the substrate.

In an embodiment of the structure, the first fin extends from a first portion of the substrate, the second fin extends from a second portion of the substrate, wherein the first portion is higher than the second portion. In a further embodiment, the first portion is higher than the second portion by about 10 nm to about 30 nm. In another embodiment of the structure, the top portion of the second fin includes silicon germanium.

In an embodiment, the structure further includes an isolation structure adjacent to the first fin and the second fin, wherein a top surface of the isolation structure is about even with a bottom surface of the top portion of the second fin. In some embodiments, the structure further includes a first gate structure over the isolation structure and engaging the first fin; and a second gate structure over the isolation structure and engaging the top portion of the second fin.

In yet another example aspect, the present disclosure is directed to a structure that includes a substrate; two first fins adjacent to each other and extending from a first region of the substrate; two second fins adjacent to each other and extending from a second region of the substrate; and an isolation structure over the substrate and adjacent to the first and the second fins. Each of the second fins includes a top portion over a bottom portion. The first fins and the bottom portions of the second fins include crystalline silicon. The top portions of the second fins include silicon germanium. Top surfaces of the second fins and top surfaces of the first fins are substantially coplanar. Each of the second fins is taller than the first fins.

In an embodiment of the structure, a first portion of the isolation structure extends laterally between the two first fins, a second portion of the isolation structure extends laterally between the two second fins, a first spacing between the two first fins is about equal to a second spacing between the two second fins, and a depth of the first portion of the isolation structure is less than a depth of the second portion of the isolation structure. In a further embodiment, a third portion of the isolation structure extends laterally between one of the two first fins and one of the two second fins, and a depth of the third portion of the isolation structure is greater than the depth of the second portion of the isolation structure.

In an embodiment of the structure, a first portion of the isolation structure extends laterally between the two first fins, a second portion of the isolation structure extends laterally between the two second fins, a first spacing between the two first fins is less than a second spacing between the two second fins, and a depth of the first portion of the isolation structure is less than a depth of the second portion of the isolation structure. In a further embodiment, a third portion of the isolation structure extends laterally between one of the two first fins and one of the two second fins, and a depth of the third portion of the isolation structure is greater than the depth of the first portion of the isolation structure and is smaller than the depth of the second portion of the isolation structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a substrate having a first semiconductor material;
   creating a mask that covers an nFET region of the substrate;
   etching a pFET region of the substrate to form a trench;
   epitaxially growing a second semiconductor material in the trench, wherein the second semiconductor material is different from the first semiconductor material; and after the epitaxially growing of the second semiconductor material in the trench, patterning the nFET region and the pFET region to produce a first fin in the nFET region and a second fin in the pFET region, wherein the patterning of the nFET region and the pFET region recesses a top surface of the substrate such that a first portion of the top surface of the substrate in the nFET region is flat, a second portion of the top surface of the substrate in the pFET region is flat, and the first portion of the top surface of the substrate is higher than the second portion of the top surface of the substrate, wherein the first fin includes the first semiconductor material protruding continuously from the substrate and the second fin includes a top portion over a bottom portion, wherein the top portion includes the second semiconductor material, and the bottom portion includes the first semiconductor material.

2. The method of claim 1, wherein the substrate is a silicon substrate, and the second semiconductor material is silicon germanium.

3. The method of claim 1, further comprising:
   planarizing a top surface of the nFET region and the pFET region after the epitaxially growing of the second semiconductor material.

4. The method of claim 1, wherein the patterning of the nFET region and the pFET region includes:
   forming fin hard masks over the nFET region and the pFET region; and
   etching the nFET region and the pFET region through the fin hard masks by a same process to produce the first and the second fins.

5. The method of claim 4, wherein the etching of the nFET region and the pFET region includes:
   anisotropically etching the nFET region and the pFET region through the fin hard masks;
   after the anisotropically etching, isotropically etching the nFET region and the pFET region through the fin hard masks;
   treating a structure resulted from the anisotropically etching and the isotropically etching with a treatment gas mixture; and
   repeating the anisotropically etching, the isotropically etching, and the treating to produce the first fin in the nFET region and the second fin in the pFET region, wherein the anisotropically etching, the isotropically etching, and the treating apply different gases.

6. The method of claim 5, wherein the anisotropically etching includes applying HBr, $Cl_2$, Ar, or a mixture thereof.

7. The method of claim 5, wherein the isotropically etching includes applying $NF_3$, $CHF_3$, $CF_4$, or a mixture thereof.

8. The method of claim 5, wherein the treating includes applying $O_2$, $CO_2$, $SF_6$, $CH_3F$, or a mixture thereof.

9. The method of claim 1, further comprising:
   forming an isolation structure between the first fin and the second fin, wherein a first bottom surface of the isolation structure adjacent to the first fin is higher than a second bottom surface of the isolation structure adjacent to the second fin by 10 nm to 30 nm.

* * * * *